(12) United States Patent
Matsumaru (10) Patent No.: US 9,478,839 B2
(45) Date of Patent: Oct. 25, 2016

(54) WIRING BOARD

(71) Applicant: FUJIKURA LTD., Koto-ku, Tokyo (JP)

(72) Inventor: Kohei Matsumaru, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/061,926

(22) Filed: Oct. 24, 2013

(65) Prior Publication Data
US 2014/0049344 A1 Feb. 20, 2014

Related U.S. Application Data

(63) Continuation of application No. PCT/JP2013/059054, filed on Mar. 27, 2013.

(30) Foreign Application Priority Data

Mar. 28, 2012 (JP) ................. 2012-073735

(51) Int. Cl.
*H01P 3/08* (2006.01)
*H01P 3/02* (2006.01)
*H05K 1/02* (2006.01)

(52) U.S. Cl.
CPC ............... *H01P 3/026* (2013.01); *H05K 1/025* (2013.01); *H05K 1/0245* (2013.01); *H05K 1/0248* (2013.01); *H05K 1/0271* (2013.01); *H05K 1/0274* (2013.01); *H05K 2201/09227* (2013.01); *H05K 2201/09727* (2013.01); *H05K 2201/09736* (2013.01); *H05K 2201/09827* (2013.01); *H05K2201/09845* (2013.01); *H05K 2201/10121* (2013.01)

(58) Field of Classification Search
CPC .................................. H03H 7/38; H01P 3/08

USPC .............................. 333/1, 4, 5, 238, 246, 33
See application file for complete search history.

(56) References Cited

U.S. PATENT DOCUMENTS 5,027,088 A    6/1991   Shimizu et al.
6,331,806 B1  12/2001   Shingyoji et al.
(Continued)

FOREIGN PATENT DOCUMENTS

CN    101604643 A    12/2009
JP    04-351102 A    12/1992
(Continued)

OTHER PUBLICATIONS

International Search Report for PCT/JP2013/059054 dated May 21, 2013.
Communication dated Nov. 3, 2014 from the Intellectual Property Office of Taiwan in counterpart application No. 102110649.
(Continued)

*Primary Examiner* — Stephen E Jones
(74) *Attorney, Agent, or Firm* — Sughrue Mion, PLLC (57) ABSTRACT

Provided is a wiring board including: a board; a differential transmission line constituted by two wirings disposed on the board in parallel; an insulation resin layer which is formed on part of a face of the board. A stepped portion constituted by a lateral face of the insulation resin layer is formed at a boundary between the face of the board and a top face of the insulation resin layer. The two wirings extend from the face of the board to the top face of the insulation resin layer so as to traverse the stepped portion. The extending direction of the wirings traversing the stepped portion and the direction of a periphery are perpendicular to each other in a plan view of the board, the periphery being defined by a boundary between the top face of the insulation resin layer and the lateral face of the insulation resin layer.

6 Claims, 12 Drawing Sheets

(56) References Cited

U.S. PATENT DOCUMENTS

| | | |
|---|---|---|
| 2002/0079575 A1 | 6/2002 | Hozoji et al. |
| 2009/0204934 A1 | 8/2009 | Lin |
| 2009/0309679 A1 | 12/2009 | Kikuchi et al. |
| 2012/0182083 A1 | 7/2012 | Kikuchi et al. |

FOREIGN PATENT DOCUMENTS

| | | |
|---|---|---|
| JP | 2736107 B2 | 4/1998 |
| JP | 2003-031724 A | 1/2003 |
| JP | 2005-340506 A | 12/2005 |
| JP | 2010-021505 A | 1/2010 |
| WO | 2011056967 A2 | 5/2011 |

OTHER PUBLICATIONS

Communication dated Apr. 8, 2014 from the Japanese Patent Office in counterpart application No. 2013-537966.

Communication dated Jan. 6, 2015 from the Japanese Patent Office in counterpart application No. 2013-537966.

Machine Translation of JP 2010021505, which was cited in the IDS filed on Oct. 24, 2013.

Machine Translation of JP 2005340506, which was cited in the IDS filed on Oct. 24, 2013.

Communication dated Dec. 3, 2015, from the European Patent Office in corresponding application No. 13769962.5.

Communication dated Oct. 29, 2015, from the State Intellectual Property Office for the People's Republic of China in counterpart application No. 201380001060.9.

$X_1-X_1'$ CROSS SECTION

FIG. 2C $X_2-X_2'$ CROSS SECTION

FIG. 2D $X_3-X_3'$ CROSS SECTION

$X_4-X_4'$ CROSS SECTION

FIG. 10C
Related Art $X_5-X_5'$ CROSS SECTION

FIG. 10D
Related Art $X_6-X_6'$ CROSS SECTION

WIRING BOARD

CROSS REFERENCE TO RELATED APPLICATIONS

This application is a continuation application based on a PCT Patent Application No. PCT/JP2013/059054, filed Mar. 27, 2013, whose priority is claimed on Japanese Patent Application 2012-073735, filed Mar. 28, 2012, the entire content of which are hereby incorporated by reference.

BACKGROUND OF THE INVENTION

1. Field of the Invention

The present invention relates to a wiring board, and specifically to a wiring board including a differential transmission line for transmitting differential signals.

2. Description of the Related Art

With the development of electronic information device, faster signaling has been required in wiring boards for use in electronic equipment. As a method of fast signal transmission, a differential transmission system has been used. The differential transmission refers to transmitting high-frequency signals (e.g., high-frequency range of 20 GHz or more), being opposite in polarity, to a pair of lines, and the signals are evaluated based on the potential difference between the lines. For this reason, the differential transmission system has an advantage of being resistant to common mode noise. Examples of wiring boards employing such a differential transmission system are shown in Japanese Patent Publication No. 2736107 and Japanese Unexamined Patent Application, First Publication No. 2003-31724.

Figure 9:
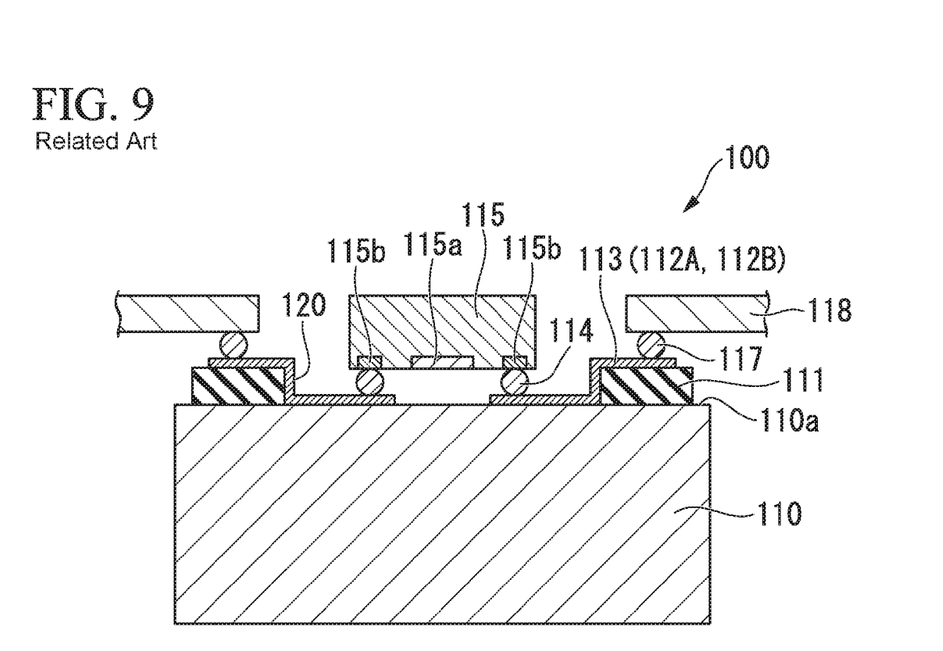
FIG. 9 is a cross-sectional view showing an example of a conventional wiring board.

FIG. 9 is a cross-sectional view showing an exemplary configuration of a conventional wiring board.

In a wiring board 100, an optical device 115 is disposed on a face 110a of a board 110. On the board 110, a differential transmission line 113 consisting of two wirings 112A and 112B disposed in parallel are formed. An end of the differential transmission line 113 and the optical device 115 are electrically connected to each other via a joint metal 114. To the other end of the differential transmission line 113, for example, a printed board 118 is connected via a joint metal 117. The optical device 115 includes a plurality of terminals 115b for inputting and outputting electric signals, and the distance (pitch) between the terminals 115b is, for example, approximately 100 μm. On the other hand, input/output terminals are formed on the printed board 118 which is connected to the other end of the differential transmission line 113, and the distance between the terminals is, for example, approximately 400 μm. The differential transmission line 113 serves as a wiring for transmitting differential signals and converts the narrower pitch of the terminals of the optical device 115 to the wider terminal pitch of the printed board 118.

An optical functional part 115a for emitting or receiving light is provided in the optical device 115, the face opposing the board 110. The board 110 is made of, for example, glass or the like, and inputting/outputting of optical signals by the optical device 115 is performed through the board 110.

In the wiring board 100 including the differential transmission line 113, the other end of the wirings 112A and 112B constituting the differential transmission line 113 is formed on an insulation resin layer 111 having a uniform thickness. The insulation resin layer 111 is provided for relaxing the stress which is transmitted from the board 110 to the printed board 118. The connection reliability between the wirings 112A and 112B and the printed board 118 is ensured by the insulation resin layer 111.

When inputting/outputting optical signals through the board 110 by the optical device 115 mounted on the board, if the insulation resin layer 111 and the wirings 112A and 112B are formed in the optical path, the transmission of optical signals is inhibited by them. In order to solve the above-described problem, as shown in FIG. 9, the insulation resin layer 111 and wirings 112A and 112B may not be provided in the optical path but the insulation layer 111 may be provided at the other end of the wirings 112A and 112B.

However, the following issues arise in the conventional wiring board 100.

Figure 10A:
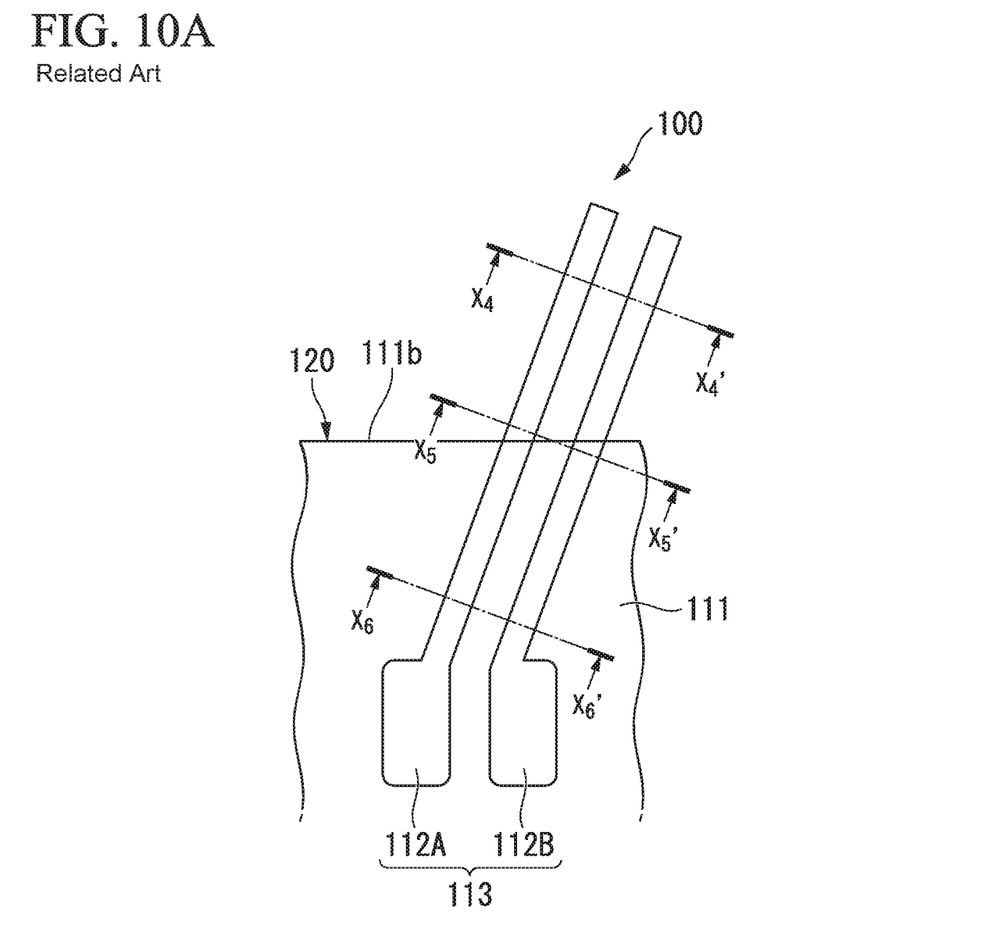
FIG. 10A is an enlarged plan view showing a differential transmission line in a conventional wiring board.
Figure 10B:
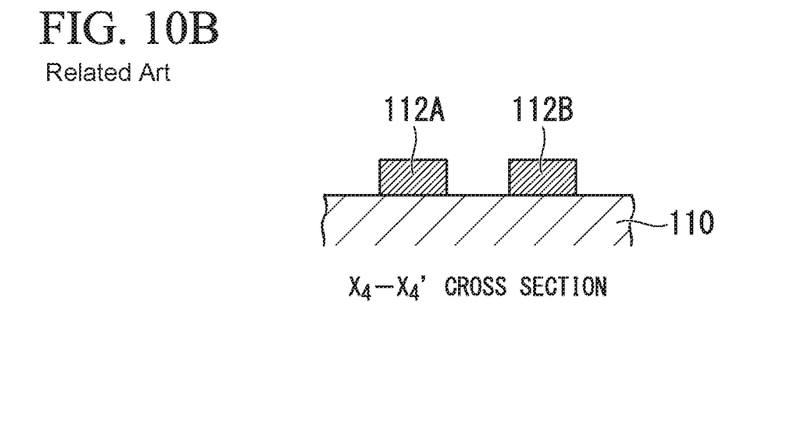
FIG. 10B is a cross-sectional view taken along the line $X_4$-$X_4'$ of FIG. 10A.
Figure 10C:
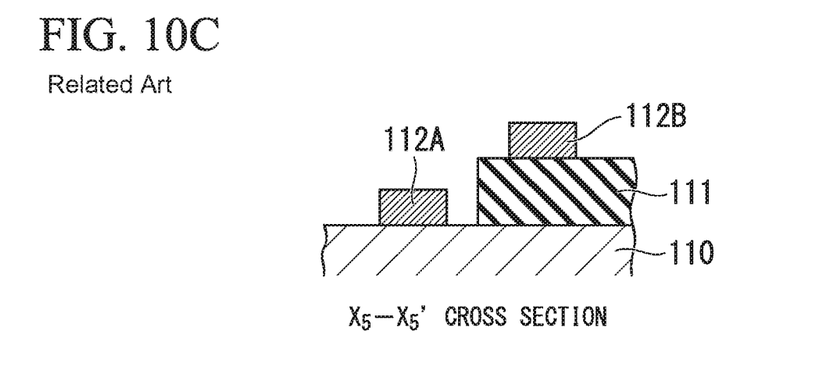
FIG. 10C is a cross-sectional view taken along the line $X_5$-$X_5'$ of FIG. 10A.
Figure 10D:
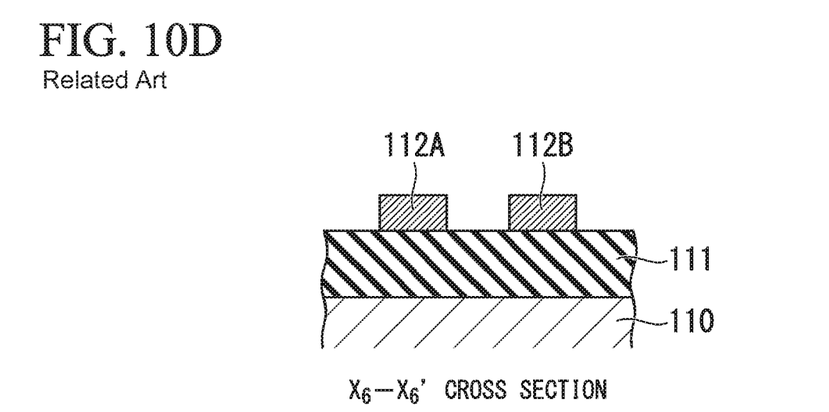
FIG. 10D is a cross-sectional view taken along the line $X_6$-$X_6'$ of FIG. 10A.

FIGS. 10A-10D are an enlarged view showing the differential transmission line 113 (wirings 112A and 112B) of the conventional wiring board 100. FIG. 10A is a plan view, and FIGS. 10B-10D are a cross-sectional view taken along line segment $X_4$-$X_4'$, line segment $X_5$-$X_5'$ line segment $X_6$-$X_6'$ shown in FIG. 10A, respectively.

As shown in FIGS. 10A-10D, the wirings 112A and 112B constitute the differential transmission line 113 which transmits high-frequency signals. The wirings 112A and 112B are formed so as to straddle (traverse) a stepped portion 120 having a height corresponding to the thickness of the insulation resin layer 111. However, as described above, it is necessary to convert the narrower pitch of the terminals of the optical device 115 to the wider pitch of the printed board 118. In a case where the extending direction of the differential transmission line 113 and the extending direction of the linear periphery 111b of the insulation resin layer 111 obliquely intersect each other in a plan view of the wiring board 100, in order to connect one end and the other end of the wirings with the shortest distance while meeting the above-described requirement, the cross-sectional shape of the two wirings 112A and 112B are different from each other at the stepped portion 120, resulting in deterioration of the transmission property of the differential transmission line 113. Specifically, in a position at which they obliquely intersect each other, the structural continuity and symmetry between the wiring 112A (+ electrode) and the wiring 112B (− electrode), which constitute the differential transmission line 113, are broken, as shown in FIG. 10C.

When designing wirings for obtaining an optimal characteristic impedance, the differential transmission line 113 is, in general, designed such that the structure of the constituent two wirings, i.e., the wiring 112A (+ electrode) and the wiring 112B (− electrode) are symmetric to each other as shown in FIG. 10B and FIG. 10D.

In the differential transmission line 113 of FIGS. 10A-10D, since nothing other than differential transmission line 113 is grounded and no capacitance C between the differential transmission line 113 and the ground exists, the capacitance C between the + electrode and the − electrode constituting the differential transmission line will exert a considerable influence on the characteristic impedance. It should be noted that in a case where wirings are provided on both faces of a wiring board, a structure such as shown in FIGS. 10A-10D will be employed in general because the back face of the board cannot be grounded due to restriction in wiring design.

In a configuration as shown in FIG. 10B and FIG. 10D, where a dielectric substance such as an air layer or an insulation resin layer continuously and symmetrically exists between the wiring 112A (+ electrode) and the wiring 112B (− electrode), it is possible to readily calculate the capacitance C between + electrode and − electrode based on the physical property of the materials, the distance between the electrodes, and the like. On the other hand, in a configuration as shown in FIG. 10C, where the structure of the wiring 112A (+ electrode) and the wiring 112B (− electrode) constituting the differential transmission line 113 is discontinuous and asymmetric, characteristic impedance mismatch and so-called intra skew (time difference in transmission between the wiring 112A and the wiring 112B) occurs in the asymmetric section, resulting in turbulence of the waveform of the transmitted signals to deteriorate the signal quality. Particularly, for high-speed transmission of more than 20 GHz, an occurrence of characteristic impedance mismatch and intra skew exert a considerable influence on the transmission property.

As a method of reducing such characteristic impedance mismatch and intra skew, one may consider adjusting the width of the wirings and the thickness of the wirings, but it is difficult to adjust the width of the wirings and the thickness of the wirings in manufacturing.

In other words, since known design methods cannot be practically applied and accurate characteristic impedance cannot be designed, impedance mismatch and intra skew cannot be avoided according to the conventional design. An occurrence of such impedance mismatch and intra skew may not be a practical issue when the frequency is up to about 10 GHz. However, in a wiring board for use in a high-frequency region of 20 GHz or more, slight mismatch of the characteristic impedance and an occurrence of intra skew will exert a considerable influence on the whole transmission path, and thus there is a demand for solving the issues.

The present invention was made in view of the above-described circumstances and an object thereof is providing a wiring board including a differential transmission line showing no difference in cross-sectional shape between two wirings disposed in parallel even in a stepped portion and having an excellent transmission property for high-frequency signals.

SUMMARY OF THE INVENTION

A wiring board according to an aspect of the present invention includes: a board; a differential transmission line which is constituted by two wirings disposed on the board in parallel; an insulation resin layer which is formed on part of a face of the board, wherein a stepped portion constituted by a lateral face of the insulation resin layer is formed at a boundary between the face of the board and a top face of the insulation resin layer, the two wirings extend from the face of the board to the top face of the insulation resin layer so as to traverse the stepped portion, and the extending direction of the wirings traversing the stepped portion and the direction of a periphery are perpendicular to each other in a plan view of the board, the periphery being defined by a boundary between the top face of the insulation resin layer and the lateral face of the insulation resin layer constituting the stepped portion.

It may be arranged such that the lateral face of the insulation resin layer constituting the stepped portion is oblique to the face of the board.

It may be arranged such that a width of the two wirings in the top face of the insulation resin layer varies such that the respective widths of the two wirings are the same as each other at each position equidistant from the periphery.

It may be arranged such that a height of the two wirings in the top face of the insulation resin layer varies such that the respective heights of the two wirings are the same as each other at each position equidistant from the periphery.

In a wiring board according to the above-described aspects of the present invention, the extending direction of the wirings traversing the stepped portion and the direction of the periphery are perpendicular to each other, the periphery being defined by the top face of the insulation resin layer and the lateral face of the insulation resin layer constituting the stepped portion. Specifically, since there is no difference in the cross-sectional shape between two wirings disposed in parallel even in a stepped portion, it is possible to resolve the impedance mismatch. Therefore, according to the aspects of the present invention, it is possible to provide a wiring board including a differential transmission line having an excellent transmission property for high-frequency signals.

DETAILED DESCRIPTION OF THE PREFERRED EMBODIMENTS

Hereinafter, wiring boards according to some embodiments of the present invention will be explained with reference to the drawings.

(First Embodiment)

Figure 1A:
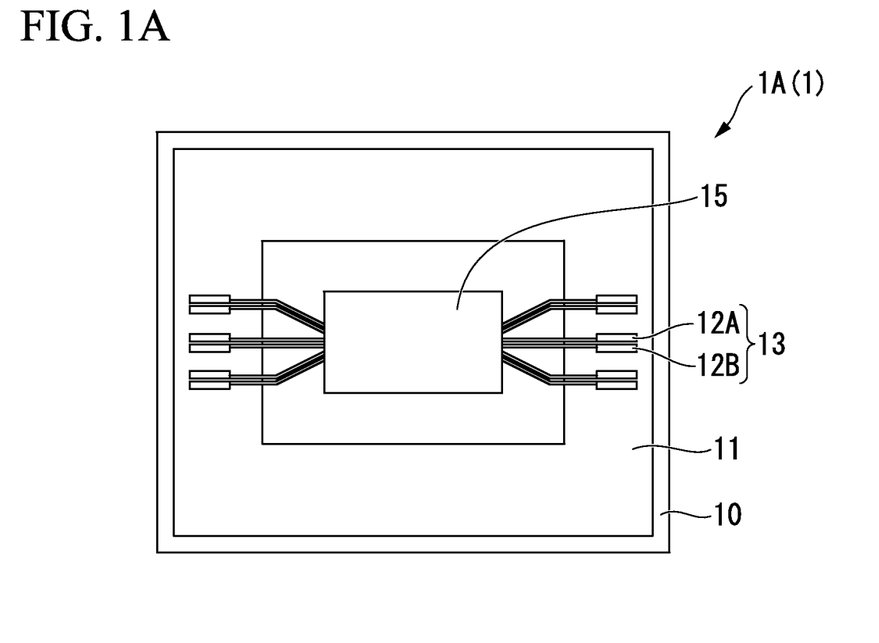
FIG. 1A is a plan view showing an exemplary configuration of a wiring board according to the first embodiment of the present invention.
Figure 1B:
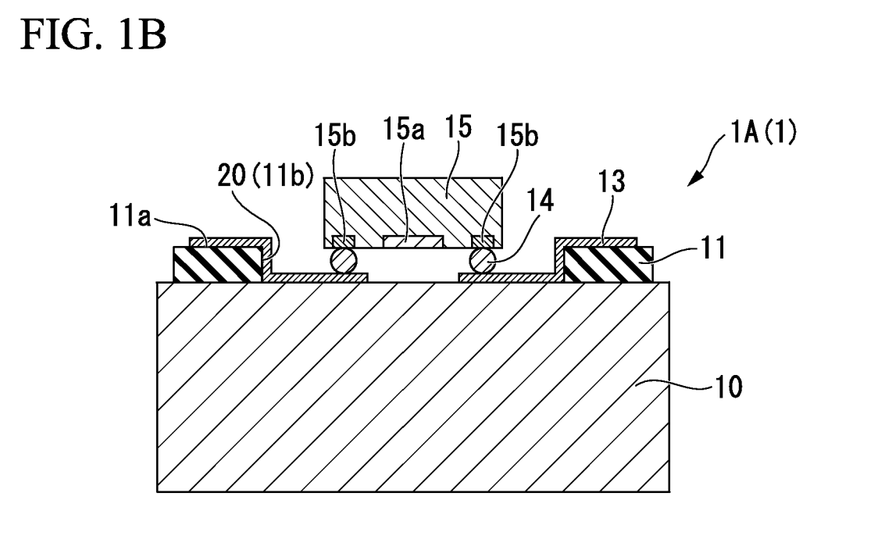
FIG. 1B is a cross-sectional view showing an exemplary configuration of a wiring board according to the embodiment.

FIGS. 1A and 1B is a view showing an exemplary configuration of a wiring 1 board according to the first embodiment of the present invention, in which FIG. 1A is a plan view while FIG. 1B is a cross-sectional view.

A wiring board 1A (1) according to the present embodiment includes a differential transmission line 13 constituted by two wirings 12A and 12B which are disposed on a face 10a of a board 10 to be parallel to each other.

The wiring board 1A (1) includes an insulation resin layer 11 (insulation layer) formed in part of the face 10a of the board 10. At the boundary between the face 10a of the board 10 and a top face 11a of the insulation resin layer 11, a stepped portion 20 is formed which is constituted by a lateral face 11b of the insulation resin layer 11. The two wirings 12A and 12B constituting the differential transmission line 13 extend from the face 10a of the board 10 to the top face 11a of the insulation resin layer 11 so as to traverse the stepped portion 20.

Moreover, an optical device 15 is disposed on the face 10a of the board 10 of the wiring board 1A (1). An optical functional part 15a for emitting or receiving light and a plurality of terminals 15b for inputting/outputting electric signals are provided in a face of the optical device 15, the face opposing the board 10. The differential transmission line 13 formed on the board 10 and the optical device 15 are electrically connected to each other via a joint metal 14.

The board 10 is made of a material having a high transparency and exhibiting a small dielectric loss in a high-frequency region. Examples of such a material include silica and borosilicate glass. The thickness of the board 10 is not particularly limited as far as the reduced height of the wiring board 1 and the wafer transfer capability are ensured, but an example thereof is 0.1-2.0 mm.

The insulation resin layer 11 (insulation layer) is selectively formed on the board 10 such that optical signals of the optical device 15 transmit therethrough without loss and so as to avoid the optical path. When the insulation resin layer 11 is not formed in the optical path but the insulation resin layer 11 is formed selectively underneath the wirings 12A and 12B of the differential transmission line 13, it is possible to perform inputting/outputting of optical signals without prevention of optical signal transmission by the insulation resin layer.

The insulation resin layer 11 should be made of a material having environmental tolerance in the post process. Examples of such a material include a polyimide resin, a silicone resin, and an epoxy resin which exhibit excellent heat resistance and chemical resistance.

The insulation resin layer 11 may have capability of enhancing mechanical strength and stress relaxation in mounting process. For example, in a case where the differential transmission line 13 and the external equipment are connected to each other by wire bonding, the insulation resin layer 11 may serves as a layer which receives a mechanical shock during the connection of a wire. In view of the above, the thickness of the insulation resin layer 11 is not particularly limited as far as its mechanical strength and capability of stress relaxation are ensured, but an example thereof is 1-20 µm. Since the differential transmission line 13 may be broken at the stepped portion 20 when the insulation resin layer 11 is too thick, the thickness of the insulation resin layer 11 is preferably 5-10 µm.

The differential transmission line 13 is constituted by the two wirings 12A and 12B disposed in parallel (transmission path). The two wirings 12A and 12B have + (positive) polarity and − (negative) polarity, respectively, and a pair of these constitute the transmission path.

The wirings 12A and 12B are made of a conductor having low resistance. The wirings 12A and 12B are formed, for example, by electrolytic Cu plating. The film thickness, width, and interval of the wiring 12A (+ electrode) and wiring 12B (− electrode) are designed so as to obtain a desirable characteristic impedance. For example, when wirings 12A and 12B made of Cu with the film thickness of 13 µm, the width of the wirings 75 µm, and the wiring interval of 40 µm are formed on the board 10 made of a glass, the differential transmission line 13 having characteristic impedance of 100Ω can be obtained.

The joint metal 14 allows the optical device 15 to electrically and mechanically connect to and be mounted on the board 10. The joint metal 14 is made of a commonly-used solder including Sn. Examples thereof include Sn—Ag—Cu based lead-free solder and AuSn solder. The height of the joint metal 14 may be arbitrarily determined based on the size and interval of outputting terminal pads of the optical device 15. For example, when both the size and interval of the outputting terminal pads of the optical device 15 are 100 µm, the width of the joint metal 14 may be 100 µm and the height of the joint metal 14 may be 20 µm.

Figure 2A:
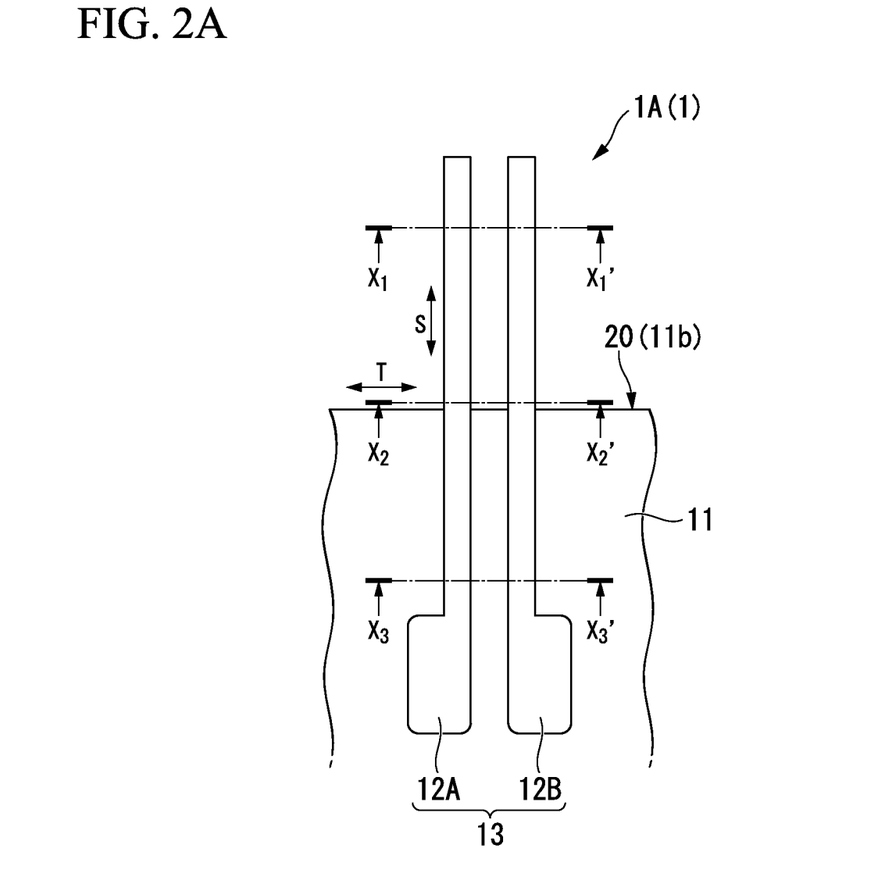
FIG. 2A is an enlarged plan view showing a differential transmission line in a wiring board according to the embodiment.
Figure 2B:
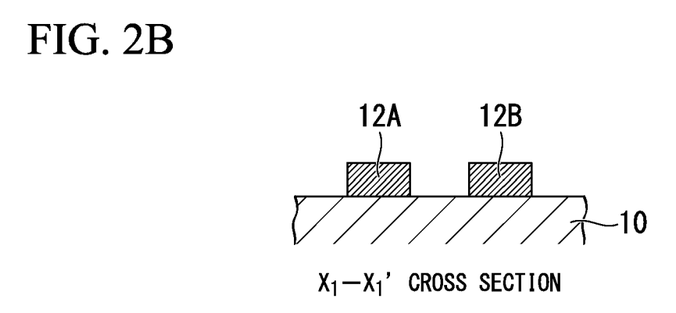
FIG. 2B is a cross-sectional view taken along the line $X_1$-$X_1'$ of FIG. 2A.
Figure 2C:
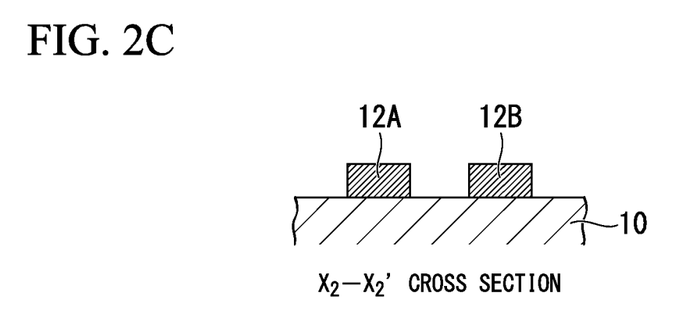
FIG. 2C is a cross-sectional view taken along the line $X_2$-$X_2'$ of FIG. 2A.
Figure 2D:
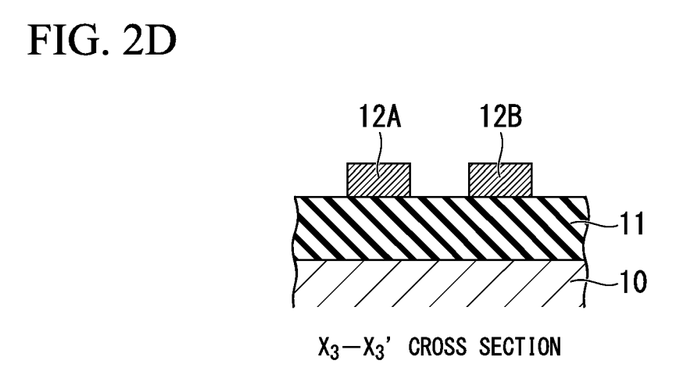
FIG. 2D is a cross-sectional view taken along the line $X_3$-$X_3'$ of FIG. 2A.

FIGS. 2A-2D are enlarged plan view showing the differential transmission line 13 (wirings 12A and 12B) in the wiring board 1A (1) according to the present embodiment. FIG. 2A is a plan view, and FIGS. 2B-2D are a cross-sectional view taken along the line segment $X_1$-$X_1$', the line segment $X_2$-$X_2$', and the line segment $X_3$-$X_3$' shown in FIG. 2A, respectively.

In the wiring board 1A (1) according to the present embodiment, as shown in FIG. 2A, the extending direction of the wirings 12A and 12B traversing the stepped portion 20 (direction S in the figure) and the direction of a periphery (direction T in the figure) are perpendicular to each other in a plan view of the board 10, the periphery being defined by the top face 11a of the insulation resin layer 11 and the lateral face 11b of the insulation resin layer 11 constituting the stepped portion 20.

In the wiring board 1A (1) according to the present embodiment, the extending direction of the wirings 12A and 12B traversing the stepped portion 20 (direction S in the figure) and the direction of the periphery (direction T in the figure) are perpendicular to each other, the periphery being defined by the top face 11a of the insulation resin layer 11 and the lateral face 11b of the insulation resin layer 11 constituting the stepped portion 20. As shown in FIGS. 2B-2D, since the cross-sectional shape of the two wirings 12A and 12B disposed in parallel is not different from each other even in the stepped portion 20, it is possible to resolve the impedance mismatch. Accordingly, based on the present embodiment, it is possible to obtain the wiring board 1A (1)

including the differential transmission line 13 having an excellent transmission property.

When the differential transmission line 13 and the edge of the insulation resin layer 11 intersect at a right angle, the cross-sectional structure of the + electrode and − electrode of the differential transmission line 13 will be continuous and symmetric, which facilitates the design of the characteristic impedance. In the cross section of the differential transmission line 13 shown in FIG. 2B and FIG. 2C, the wiring length is constant, which enables the width and film thickness of the wirings 12A and 12B to be adjusted in manufacturing. Accordingly, known design methods can be applied, and thus it is possible to implement the impedance match.

Hereinafter, the difference between the conventional wiring board 100 and a wiring board according to the present invention will be explained in detail.

Figure 11A:
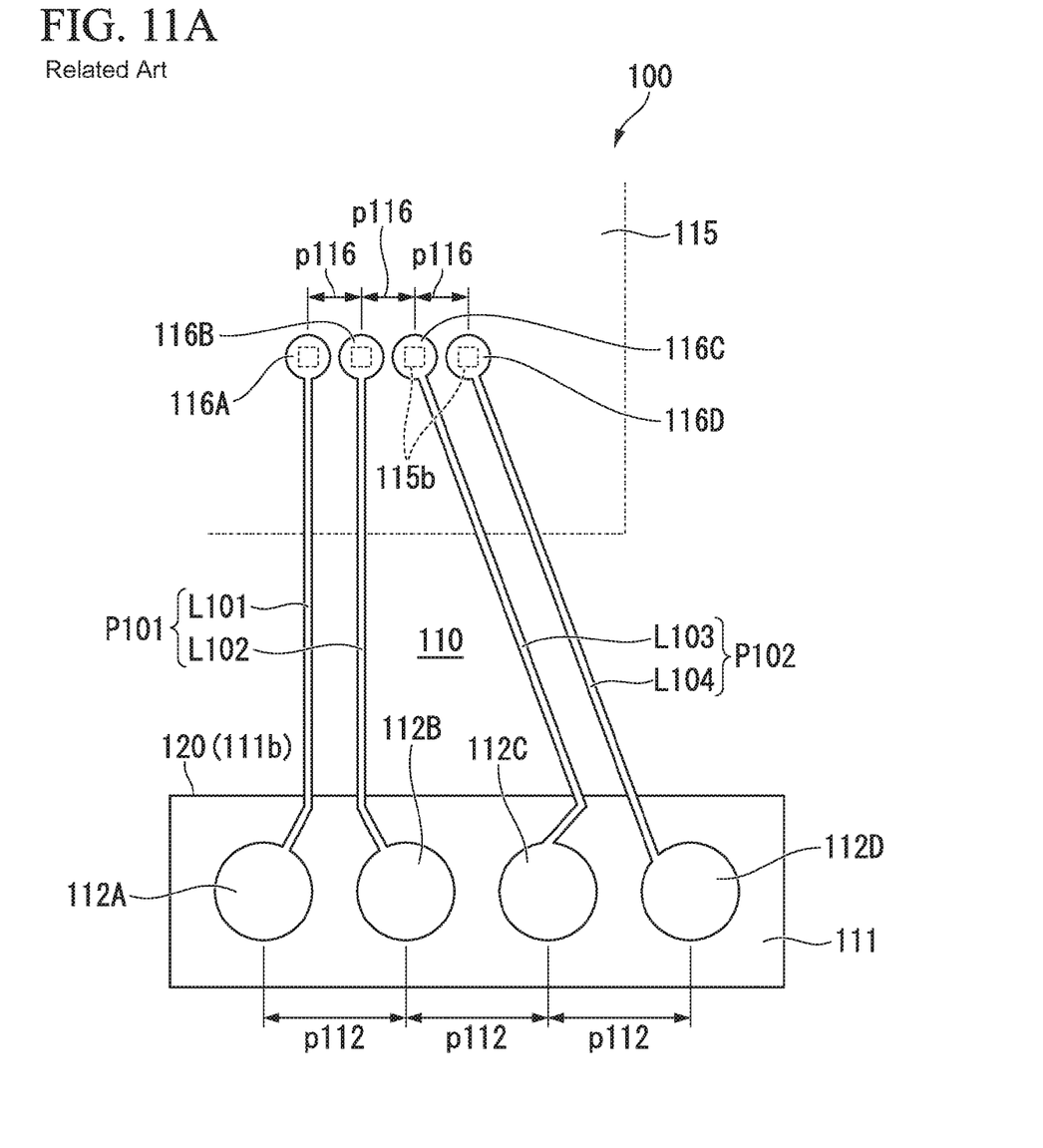
FIG. 11A is a plan view schematically showing an example of a connection between terminals of an optical device and terminals of an insulation resin layer in a conventional wiring board.
Figure 11B:
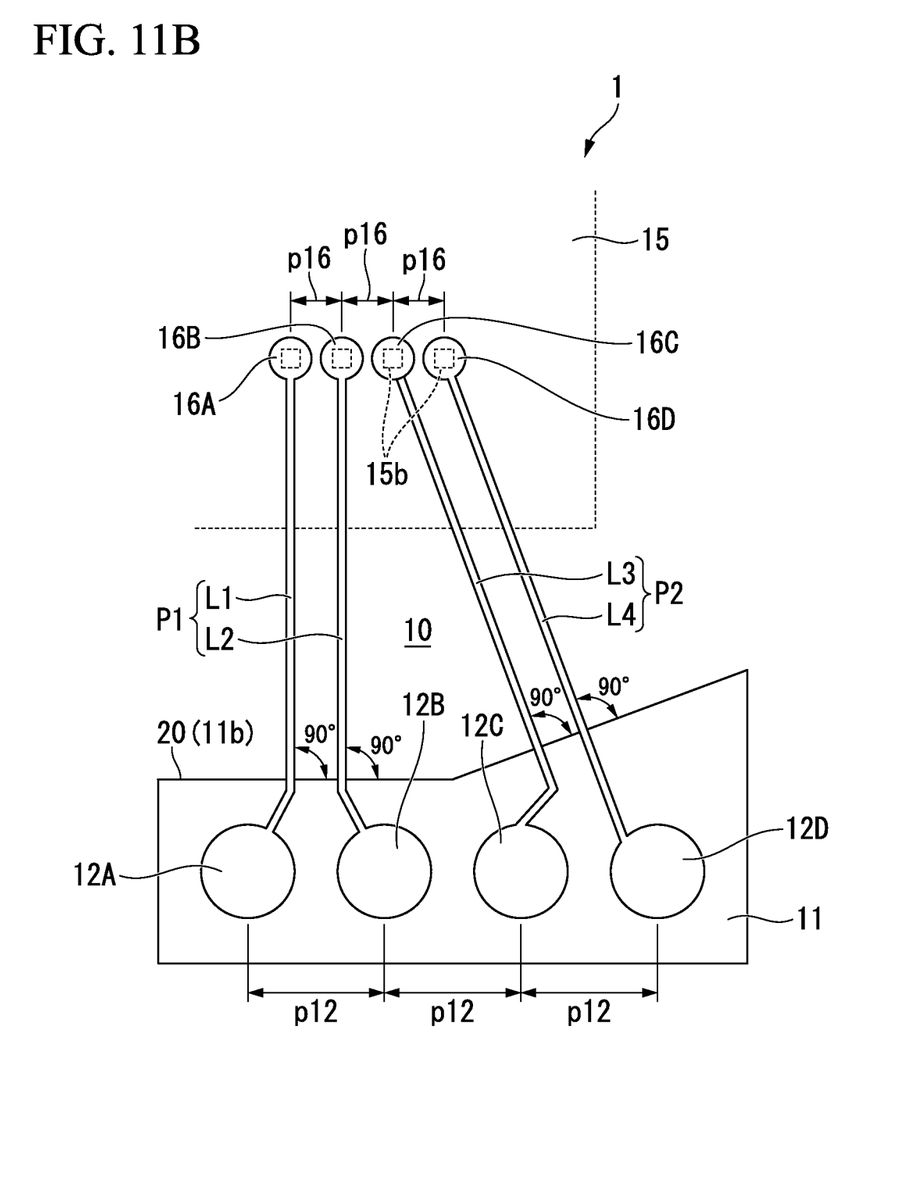
FIG. 11B is a plan view schematically showing an example of a connection between terminals of an optical device and terminals of an insulation resin layer in a wiring board according to an embodiment of the present invention.

FIG. 11A is a plan view schematically showing an example of a connection between terminals (pads) 116A-116D formed in the board 110 and the terminals (pads) 112A-112D of the insulation resin layer 111 in the conventional wiring board 100. In addition, FIG. 11B is a plan view schematically showing an example of a connection between the terminals (pads) 16A-16D formed in the board 10 and the terminals (pads) 12A-12D of the insulation resin layer 11 in the wiring board 1 according to an embodiment of the present invention.

In FIG. 11A, a plurality of the terminal pads 112A, 112B, 112C 112D . . . are formed in the insulation resin layer 111, the terminal pads being formed so as to be separate from one another by a pitch p112 (e.g., 400 μm) which corresponds, for example, to inputting/outputting terminals of the printed board 118 shown in FIG. 9. At the opposite side thereof, a plurality of terminal pads 116A, 116B, 116C, 116D . . . are formed as to be separate from one another by a pitch p116 (e.g., 100 μm) which corresponds to inputting/outputting terminals 115b of the optical device 115. In this example, those terminals are formed such that the pitch p112 is greater than the pitch p116. The terminal pads 112A-112D and the terminal pads 116A-116D are connected with wirings L101-L104.

The wirings L101-L104 connect the terminal pads together and are capable of converting the narrower pitch of the terminal pads (116A-116D) to the wider pitch of the terminal pads (112A-112D). The wirings L101 and L102 are paired to constitute a differential transmission line (pair wiring) P101, while the wiring L103 and the wiring L104 are paired to constitute another differential transmission line (pair wiring) P102.

The stepped portion 120 of the insulation resin layer 111 formed in the conventional wiring board 100 is formed so as to be parallel with the array direction of the terminal pads 112A, 112B, 112C, 112D . . . and the terminal pads 116A, 116B, 116C, 116D . . . .

The wiring L101 and the wiring L102 form a symmetric pattern with each other. The differential transmission line P101 constituted by the two wirings L101 and L102 is designed such that a favorable transmission property is obtained. However, due to the above-described requirements, the differential transmission line P102 constituted by the wiring L103 and the wiring L104 is unavoidably designed so as to obliquely intersect with the stepped portion 120 of the insulation resin layer 111. In this case, the cross-sectional shape of the two wirings L103 and L104 will differ from each other at a position where the stepped portion 120 intersects with the differential transmission line P102, which will cause problems of mismatch of the characteristic impedance and an occurrence of intra skew.

On the other hand, as shown in FIG. 11B, in the wiring board 1 according to an embodiment of the present invention, the insulation resin layer 11 is formed such that all of the wirings L1-L4 intersect with the stepped portion 20 at a right angle, the wirings L1-L4 connecting the terminal pads 16A-16D disposed on the board 10 with a pitch p16 (e.g., 100 μm) to the terminal pads 12A-12D of the insulation resin layer 11 disposed with a pitch p12 (e.g., 400 μm). Specifically, both the differential transmission line P1 constituted by the wirings L1 and L2 and the differential transmission line P2 constituted by the wirings L3 and L4 are perpendicular to the stepped portion 20. Therefore, it is possible to prevent turbulence of differential signals at the stepped portion 20 and obtain a favorable transmission property.

Figure 3A:
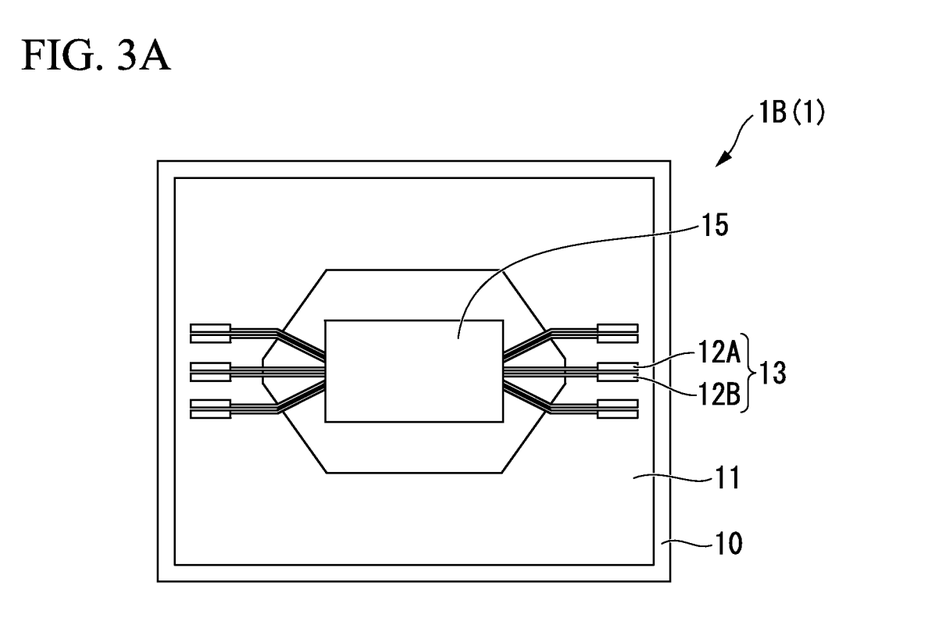
FIG. 3A is a plan view showing another exemplary configuration of a wiring board according to the embodiment.
Figure 3B:
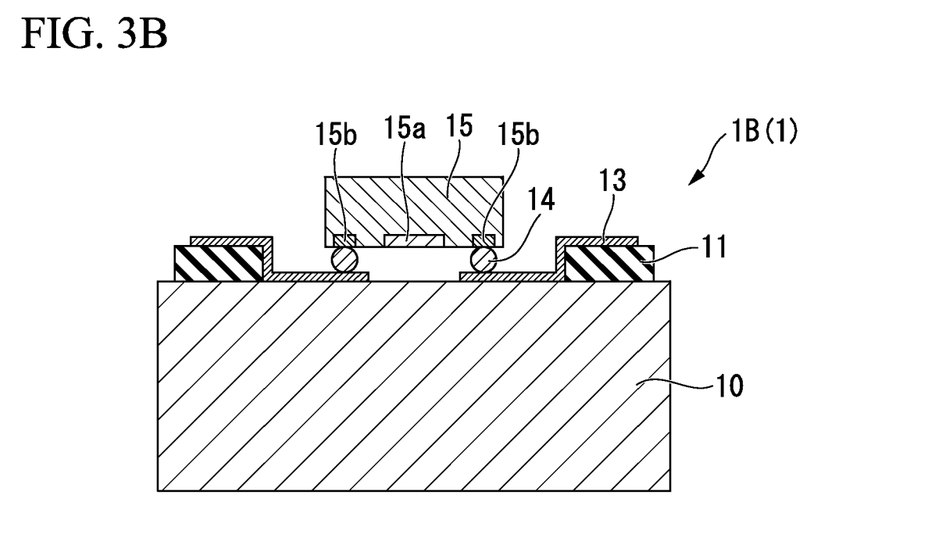
FIG. 3B is a plan view showing another exemplary configuration of a wiring board according to the embodiment.

FIGS. 3A and 3B is a view showing another exemplary configuration of the wiring board according to the present embodiment, where FIG. 3A is a plan view and FIG. 3B is a cross-sectional view.

In a wiring board 1B (1), the wirings 12A and 12B flexed in the vicinity of the opening edge of the insulation resin layer 11 and the opening edge (periphery) of the insulation resin layer 11 are perpendicular to each other.

(Second Embodiment)

Hereinafter, a wiring board 1 according to the second embodiment of the present invention will be explained.

It should be noted that components different from that of the above-described first embodiment will be mainly explained below and explanations of the same components as that of the first embodiment will be omitted.

Figure 4A:
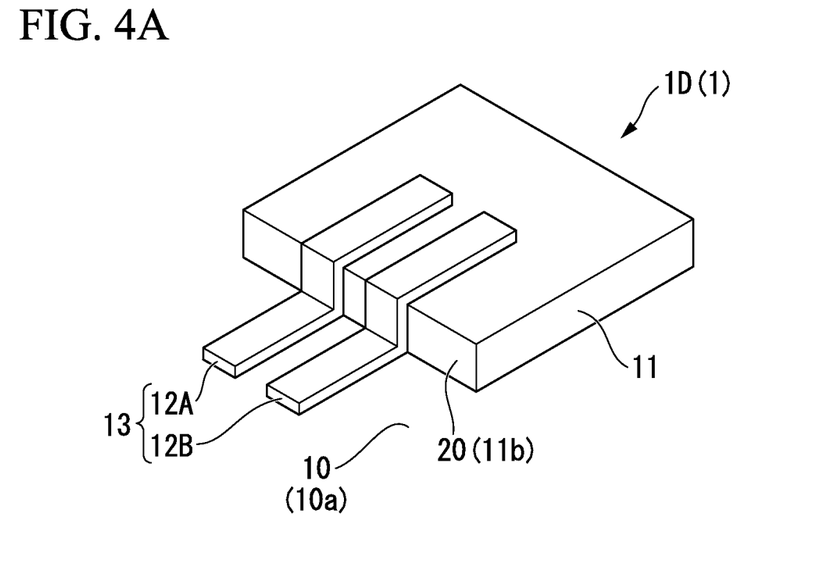
FIG. 4A is an enlarged perspective view showing a differential transmission line in an exemplary configuration of a wiring board according to the second embodiment of the present invention.
Figure 4B:
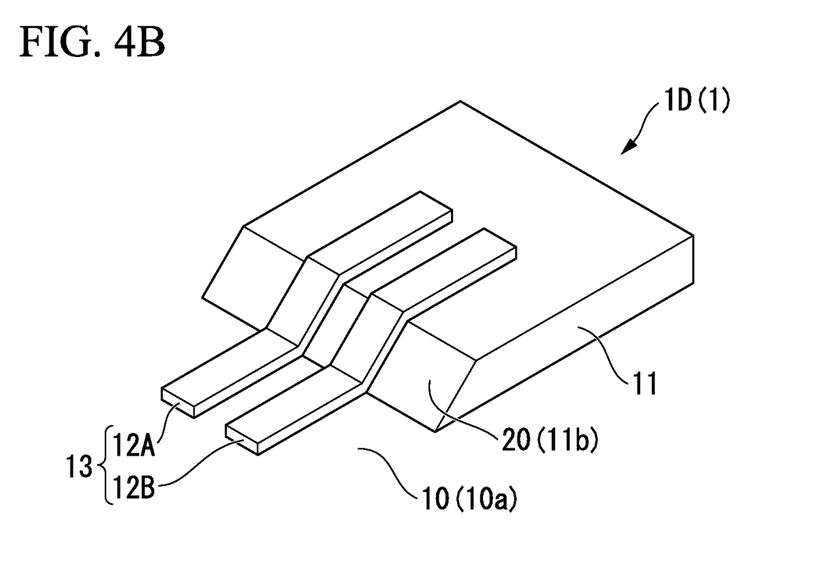
FIG. 4B is an enlarged perspective view showing a differential transmission line in an exemplary configuration of a wiring board according to the embodiment.

FIGS. 4A and 4B are a view showing an exemplary configuration of the wiring board according to the present embodiment, and particularly is an enlarged perspective view showing a differential transmission line.

In the above-described first embodiment, as shown in FIG. 4A, the lateral face 11b of the insulation resin layer 11 constituting the stepped portion 20 is substantially perpendicular to the face 10a of the board 10.

In contrast, in a wiring board 1D (1) according to the present embodiment (second embodiment), as show in FIG. 4B, the lateral face 11b of the insulation resin layer 11 constituting the stepped portion 20 is oblique to the face 10a of the board 10. Although FIG. 4B shows an example of the lateral face 11b of the insulation resin layer 11 being formed so as to have an angle of inclination with respect to the face 10a of the board 10, the present invention is not limited to this. For example, the lateral face 11b of the insulation resin layer 11 constituting stepped portion 20 may be formed to be convex upward, concave downward, or convex upward in some parts and concave downward in other parts in FIG. 4B.

It is preferable that the lateral face 11b of the insulation resin layer 11 be provided such that the two wirings 12A and 12B incline at the same level to ensure the continuity and symmetry of the structure between the + electrode (wiring 12A) and − electrode (wiring 12B) of the differential transmission line 13.

(Third Embodiment)

Hereinafter, a wiring board 1 according to the third embodiment of the present invention will be explained.

It should be noted that components different from that of the above-described first embodiment will be mainly explained below and explanations of the same components as that of the first embodiment will be omitted.

FIG. 5-FIG. 8 are a view showing an exemplary configuration of the wiring board according to the present embodiment, and particularly is an enlarged perspective view showing a differential transmission line.

Figure 5:
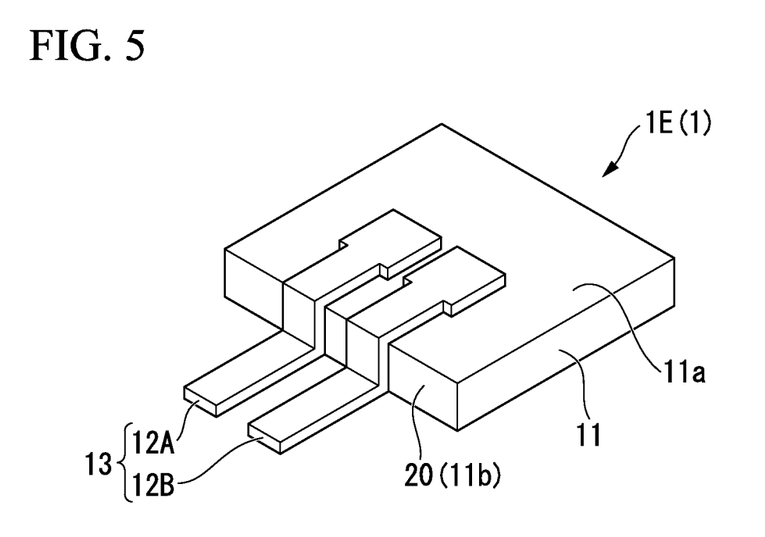
FIG. 5 is an enlarged perspective view showing a differential transmission line in an exemplary configuration of a wiring board according to the third embodiment of the present invention.

In a wiring board 1E (1) shown in FIG. 5, the width of the two wirings 12A and 12B in the top face 11a of the insulation resin layer 11 varies such that the respective widths of the two wirings 12A and 12B are the same as each other at each position equidistant from the periphery (11b).

In the wiring board 1E (1) according to the present embodiment, since the width of the two wirings 12A and 12B in the top face 11a of the insulation resin layer 11 varies such that the widths of the two wirings 12A and 12B are the same as each other at each position equidistant from the periphery, the continuity and symmetry of the structure between the + electrode (wiring 12A) and − electrode (wiring 12B) of the differential transmission line 13 can be ensured, and thus impedance mismatch can be inhibited. Accordingly, the wiring board 1E (1) can exhibit an excellent transmission property.

Figure 6:
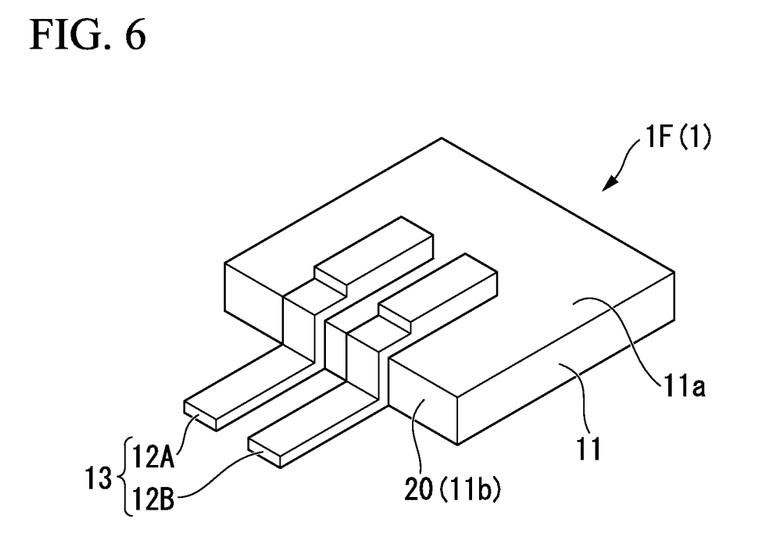
FIG. 6 is an enlarged perspective view showing a differential transmission line in an exemplary configuration of a wiring board according to the embodiment.

In addition, in a wiring board 1F (1) shown in FIG. 6, the height of the two wirings 12A and 12B in the top face 11a of the insulation resin layer 11 varies such that the heights of the two wirings 12A and 12B are the same as each other at each position equidistant from the periphery.

In the wiring board 1F (1) according to the present embodiment, periphery, since the height of the two wirings 12A and 12B in the top face 11a of the insulation resin layer 11 varies such that the heights of the two wirings 12A and 12B are the same as each other at each position equidistant from the periphery, the continuity and symmetry of the structure between the + electrode (wiring 12A) and − electrode (wiring 12B) of the differential transmission line 13 can be ensured, and thus impedance mismatch can be inhibited. Accordingly, the wiring board 1F (1) can exhibit an excellent transmission property.

Figure 7:
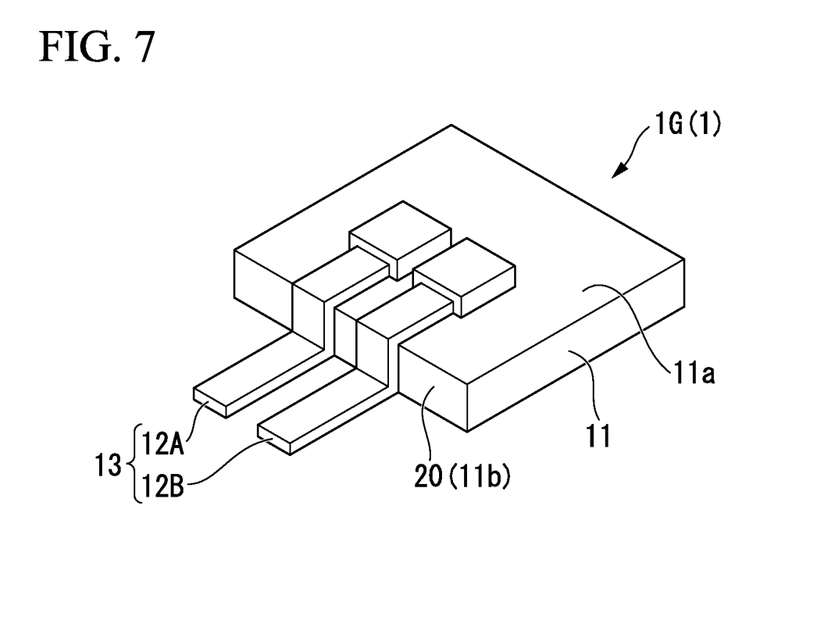
FIG. 7 is an enlarged perspective view showing a differential transmission line in an exemplary configuration of a wiring board according to the embodiment.

In a wiring board 1G (1) shown in FIG. 7, the width and height of the two wirings 12A and 12B in the top face 11a of the insulation resin layer 11 varies such that the widths and heights of the two wirings 12A and 12B are the same as each other at each position equidistant from the periphery.

In the wiring board 1G (1) according to the present embodiment, since the width and height of the two wirings 12A and 12B in the top face 11a of the insulation resin layer 11 varies such that the widths and heights of the two wirings 12A and 12B are the same as each other at each position equidistant from the periphery, the continuity and symmetry of the structure between the + electrode (wiring 12A) and − electrode (wiring 12B) of the differential transmission line 13 can be ensured, and thus impedance mismatch can be inhibited. Accordingly, the wiring board 1G (1) can exhibit an excellent transmission property.

Figure 8:
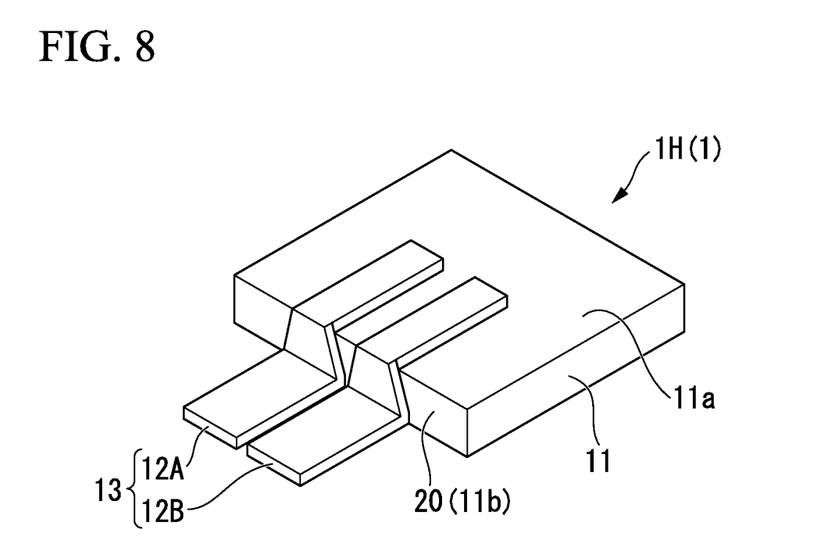
FIG. 8 is an enlarged perspective view showing a differential transmission line in an exemplary configuration of a wiring board according to the embodiment.

In a wiring board 1H (1) shown in FIG. 8, the shape of the two wirings 12A and 12B in the top face 11a of the insulation resin layer 11 varies such that the shapes of the two wirings 12A and 12B are the same as each other at each position equidistant from the periphery.

In the wiring board 1H (1) according to the present embodiment, periphery, since the shape of the two wirings 12A and 12B in the top face 11a of the insulation resin layer 11 varies such that the shapes of the two wirings 12A and 12B are the same as each other at each position equidistant from the periphery, the continuity and symmetry of the structure between the + electrode (wiring 12A) and − electrode (wiring 12B) of the differential transmission line 13 can be ensured, and thus impedance mismatch can be inhibited. Accordingly, the wiring board 1H (1) can exhibit an excellent transmission property.

Although the wiring board according to each embodiment of the present invention has been described above, the present invention is not limited only to these embodiments, and appropriate modifications may be made thereto if necessary without departing from the scope of the present invention.

The present invention can be widely applied to a wiring board including a differential transmission line.

What is claimed is:

1. A wiring board comprising:
    a board;
    a differential transmission line which is constituted by two wirings each having a first end and a second end, the wirings extending on the board in parallel;
    an insulation resin layer which is formed on part of a face of the board, wherein
    the first ends of the wirings are connected to two outside terminal pads, the outside terminal pads being separately disposed with a pitch p1,
    a stepped portion constituted by a lateral face of the insulation resin layer is formed at a boundary between the face of the board and a top face of the insulation resin layer,
    the two wirings extend from the face of the board to the top face of the insulation resin layer so as to traverse the stepped portion,
    the second ends of the wirings are connected to two inside terminal pads on the insulation resin layer, the inside terminal pads being separately disposed with a pitch p2, the pitch p2 being greater than the pitch p1, and
    the extending direction of the wirings traversing the stepped portion and the direction of a periphery are perpendicular to each other in a plan view of the board, the periphery being defined by a boundary between the top face of the insulation resin layer and the lateral face of the insulation resin layer constituting the stepped portion.

2. The wiring board according to claim 1, wherein the lateral face of the insulation resin layer constituting the stepped portion is oblique to the face of the board.

3. The wiring board according to claim 1, wherein a width of the two wirings in the top face of the insulation resin layer varies such that the respective widths of the two wirings are the same as each other at each position equidistant from the periphery.

4. The wiring board according to claim 1, wherein a height of the two wirings in the top face of the insulation resin layer varies such that the respective heights of the two wirings are the same as each other at each position equidistant from the periphery.

5. The wiring board according to claim 1, wherein the lateral face of insulation resin layer constituting the stepped portion is substantially perpendicular to the face of the board.

6. A wiring board comprising:
    a board;
    a first differential transmission line which is constituted by two wirings each having a first end and a second end, the wirings extending on the board in parallel;
    a second differential transmission line which is constituted by two wirings each having a third end and a fourth end, the wirings extending on the board in parallel;
    an insulation resin layer which is formed on part of a face of the board, wherein the first differential transmission line and the second differential transmission line are arranged so as not be parallel to each other on the board, the first ends of the wirings of the first differential transmission line and the third ends of the wirings of the second differential transmission line are connected to four outside terminal pads, the outside terminal pads being separately disposed with a pitch p1, a stepped portion constituted by a lateral face of the insulation resin layer is formed at a boundary between the face of the board and a top face of the insulation resin layer, the two wirings of the first differential transmission line and the two wirings of the second differential transmission line extend from the face of the board to the top face of the insulation resin layer so as to traverse the stepped portion, the second ends of the wirings of the first differential transmission line and the fourth ends of the wirings of the second differential transmission line are connected to four inside terminal pads on the insulation resin layer, the inside terminal pads being separately disposed with a pitch p2, the pitch p2 being greater than the pitch p1, and the extending direction of the wirings of the first differential transmission line and the wirings of the second differential transmission line which are traversing the stepped portion and the direction of a periphery are perpendicular to each other in a plan view of the board, the periphery being defined by a boundary between the top face of the insulation resin layer and the lateral face of the insulation resin layer constituting the stepped portion.

* * * * *